(12) United States Patent
Furukawa et al.

(10) Patent No.: US 7,265,013 B2
(45) Date of Patent: Sep. 4, 2007

(54) SIDEWALL IMAGE TRANSFER (SIT) TECHNOLOGIES

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US); Kirk D. Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 11/162,662

(22) Filed: Sep. 19, 2005

(65) Prior Publication Data

US 2007/0066009 A1    Mar. 22, 2007

(51) Int. Cl.
*H01L 21/8242* (2006.01)
*H01L 21/336* (2006.01)

(52) U.S. Cl. ............... 438/239; 438/254; 438/712; 257/E21.038; 257/E21.206

(58) Field of Classification Search ........... 438/239, 438/254, 712, 736, 944
See application file for complete search history.

(56) References Cited

U.S. PATENT DOCUMENTS

| | | | |
|---|---|---|---|
| 4,808,545 A | 2/1989 | Balasubramanyam et al. | |
| 5,651,857 A | 7/1997 | Cronin et al. | |
| 5,795,830 A | 8/1998 | Cronin et al. | |
| 6,194,268 B1 | 2/2001 | Furukawa et al. | |
| 6,365,456 B1* | 4/2002 | Cereda et al. | 438/257 |
| 6,855,980 B2* | 2/2005 | Wang et al. | 257/321 |
| 2003/0197194 A1 | 10/2003 | Fried et al. | |
| 2004/0262698 A1 | 12/2004 | Nowak | |
| 2005/0009305 A1 | 1/2005 | Anderson et al. | |
| 2006/0060562 A1* | 3/2006 | Furukawa et al. | 216/41 |
| 2007/0059891 A1* | 3/2007 | Furukawa et al. | 438/299 |

\* cited by examiner

*Primary Examiner*—Alexander Ghyka
(74) *Attorney, Agent, or Firm*—Schmeiser, Olsen & Watts; William D. Sabo

(57) ABSTRACT

A structure fabrication method. The method comprises providing a structure which comprises (a) a to-be-etched layer, (b) a memory region, (c) a positioning region, (d) and a capping region on top of one another. Then, the positioning region is indented. Then, a conformal protective layer is formed on exposed-to-ambient surfaces of the structure. Then, portions of the conformal protective layer are removed so as to expose the capping region to the surrounding ambient without exposing the memory region to the surrounding ambient. Then, the capping region is removed so as to expose the positioning region to the surrounding ambient. Then, the positioning region is removed so as to expose the memory region to the surrounding ambient. Then, the memory region is directionally etched with remaining portions of the conformal protection layer serving as a blocking mask.

30 Claims, 9 Drawing Sheets

SIDEWALL IMAGE TRANSFER (SIT) TECHNOLOGIES

BACKGROUND OF THE INVENTION

1. Technical Field

The present invention relates to sidewall image transfer (SIT) technologies, and more specifically, to improvements to SIT technologies.

2. Related Art

In a conventional sidewall image transfer (SIT) process, a memory region is formed from a memory layer and then used as a blocking mask for etching one or more layer beneath the memory region so as to transfer the image of the memory region down to the underlying layer(s). The formation of the memory region from the memory layer involves a planarization-and-etchback step. However, the planarization-and-etchback step may damage the memory region due to pattern density variation on the wafer. Therefore, there is a need for improvements to sidewall image transfer (SIT) technologies that are not affected by pattern density variation on the wafer.

SUMMARY OF THE INVENTION

The present invention provides a structure fabrication method, comprising providing a structure which comprises (a) a to-be-etched layer, (b) a memory region on the to-be-etched layer, (c) a positioning region on the memory region such that the memory region is sandwiched between the to-be-etched layer and the positioning region, (d) and a capping region on the positioning region such that the positioning region is sandwiched between the memory region and the capping region; indenting the positioning region so as to undercut the capping region; forming a conformal protective layer on exposed-to-ambient surfaces of the structure after said indenting is performed; removing portions of the conformal protective layer so as to expose the capping region to the surrounding ambient without exposing the memory region to the surrounding ambient; removing the capping region, after said removing the portions of the conformal protective layer is performed, so as to expose the positioning region to the surrounding ambient; removing the positioning region, after said removing the capping region is performed, so as to expose the memory region to the surrounding ambient; and directionally etching the memory region with remaining portions of the conformal protection layer serving as a blocking mask for said directionally etching the memory region, after said removing the positioning region is performed.

The present invention also provides a structure fabrication method, comprising providing a structure which comprises (a) a to-be-etched layer, (b) a memory layer on the to-be-etched layer, (c) a positioning layer on the memory layer such that the memory layer is sandwiched between the to-be-etched layer and the positioning layer, (d) and a capping region on the positioning layer such that the positioning layer is sandwiched between the memory layer and the capping region; directionally etching the positioning layer and the memory layer with the capping region serving as a blocking mask for said directionally etching the positioning layer and the memory layer, wherein what remain of the positioning layer and the memory layer as a result of said directionally etching the positioning layer and the memory layer comprise a positioning region and a memory region, respectively; indenting the positioning region so as to undercut the capping region; forming a conformal protective layer on exposed-to-ambient surfaces of the structure after said indenting is performed; removing portions of the conformal protective layer so as to expose the capping region to the surrounding ambient without exposing the memory region to the surrounding ambient; removing the capping region, after said removing the portions of the conformal protective layer is performed, so as to expose the positioning region to the surrounding ambient; removing the positioning region, after said removing the capping region is performed, so as to expose the memory region to the surrounding ambient; and directionally etching the memory region with remaining portions of the conformal protection layer serving as a blocking mask for said directionally etching the memory region, after said removing the positioning region is performed.

The present invention also provides a structure fabrication method, comprising providing a structure which comprises (a) a to-be-etched layer, (b) a memory region on the to-be-etched layer, (c) a positioning region on the memory region such that the memory region is sandwiched between the to-be-etched layer and the positioning region, (d) and a capping region on the positioning region such that the positioning region is sandwiched between the memory region and the capping region; indenting the positioning region so as to undercut the capping region; forming a protective layer on exposed-to-ambient surfaces of the structure after said indenting is performed; removing portions of the protective layer so as to expose the capping region to the surrounding ambient without exposing the memory region to the surrounding ambient; removing the capping region, after said removing the portions of the protective layer is performed, so as to expose the positioning region to the surrounding ambient; removing the positioning region, after said removing the capping region is performed, so as to expose the memory region to the surrounding ambient; and directionally etching the memory region with remaining portions of the protection layer serving as a blocking mask for said directionally etching the memory region, after said removing the positioning region is performed.

The present invention also provides a structure fabrication method, comprising providing a structure which comprises (a) a to-be-etched layer, (b) a memory region on the to-be-etched layer, (c) a positioning region on the memory region such that the memory region is sandwiched between the to-be-etched layer and the positioning region; indenting the positioning region such that a first memory portion of the memory region becomes not directly beneath the indented positioning region as a result of said indenting, while a second memory portion of the memory region remains directly beneath the indented positioning region; selectively growing a protective region onto exposed-to-ambient surfaces of the first memory portion of the memory region but not onto exposed-to-ambient surfaces of the positioning region; removing the positioning region, after said selectively growing is performed, so as to expose the second memory portion of the memory region to the surrounding ambient; and directionally etching the second memory portion of the memory region with the protective region serving as a blocking mask, after said removing the positioning region is performed.

The present invention provides improvements to sidewall image transfer (SIT) technologies that are not affected by pattern density variation on the wafer.

DETAILED DESCRIPTION OF THE INVENTION

Figure 1:
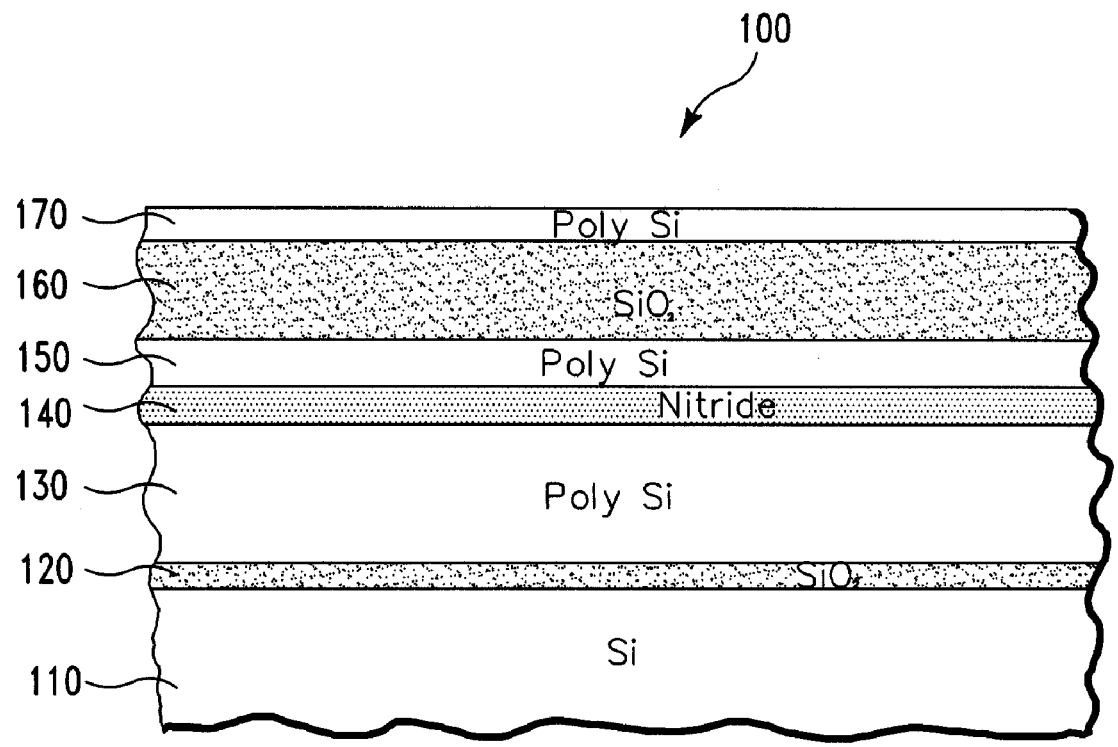
FIGS. 1-7 show cross-section views of a structure going through fabrication steps of an improved sidewall image transfer (SIT) process, in accordance with embodiments of the present invention.

FIGS. 1-7 show cross-section views of a structure 100 going through fabrication steps of an improved sidewall image transfer (SIT) process, in accordance with embodiments of the present invention. More specifically, with reference to FIG. 1, in one embodiment, the improved SIT process starts out with a semiconductor substrate 110, a gate dielectric layer 120, a gate electrode layer 130, a hard mask layer 140, a memory layer 150, a positioning layer 160, and a capping layer 170 on top of one another as shown. Illustratively, the layers 110, 120, 130, 140, 150, 160, and 170 comprise silicon (Si), silicon dioxide ($SiO_2$), polysilicon, silicon nitride, polysilicon, silicon dioxide, and polysilicon, respectively.

Figure 2:
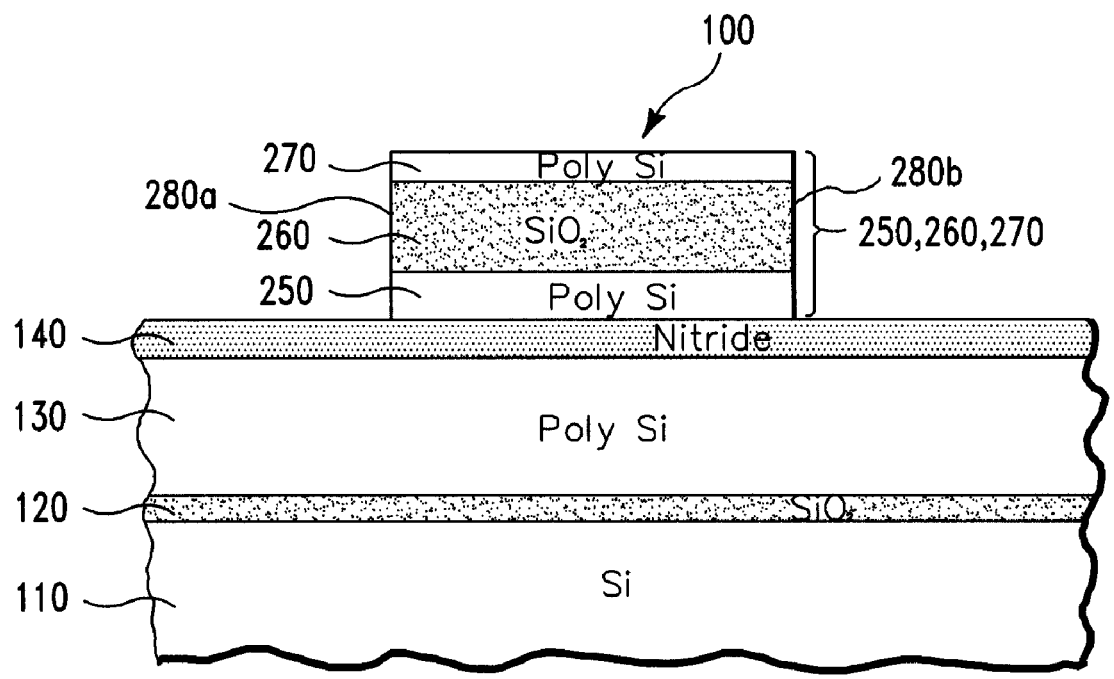

Next, with reference to FIG. 2, in one embodiment, a block 250,260,270 is formed from the polysilicon memory layer 150, the oxide positioning layer 160, and the polysilicon capping layer 170 (FIG. 1). More specifically, the block 250,260,270 comprises a polysilicon memory region 250, an oxide positioning region 260, and a polysilicon capping region 270 which are formed from the polysilicon memory layer 150, the oxide positioning layer 160, and the polysilicon capping layer 170, respectively (FIG. 1). It should be clear later that side walls 280a and 280b of the block 250,260,270 will determine the positions of two gate electrode regions 130a and 130b (FIG. 7), respectively.

In one embodiment, the block 250,260,270 is formed by a conventional lithographic process. More specifically, with reference to both FIGS. 1 and 2, a photoresist layer (not shown) is formed on top of the structure 100, then is exposed to lights through a mask/reticle (not shown) containing patterns to be transferred to the structure 100, and then developed away except for a resist region (not shown) directly above where the block 250,260,270 is to be formed. The resist region is then used as a blocking mask for etching through the polysilicon capping layer 170, the oxide positioning layer 160, and the polysilicon memory layer 150 in that order, stopping at the nitride hard mask layer 140 and resulting in the block 250,260,270.

Figure 3:
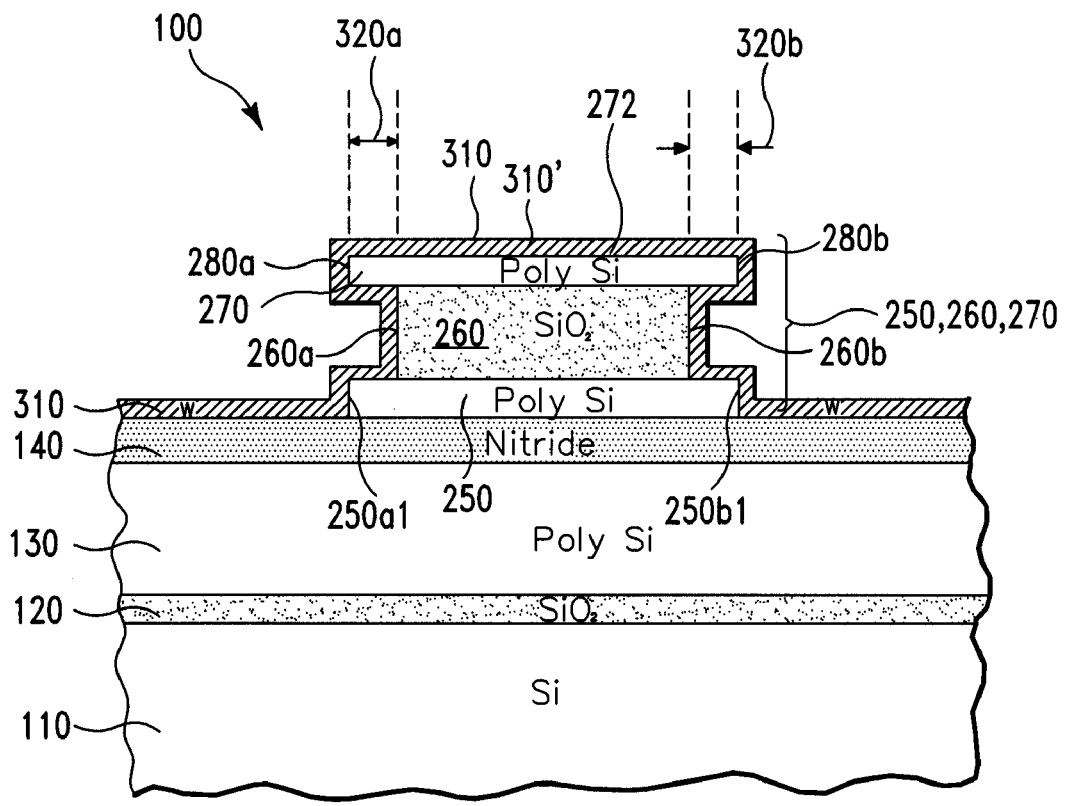

Next, with reference to FIG. 2, in one embodiment, the oxide positioning region 260 of the block 250,260,270 is laterally indented (i.e., trimmed) so as to undercut the polysilicon capping region 270 resulting in the oxide positioning region 260' of FIG. 3. Illustratively, the oxide positioning region 260 is laterally indented by a chemical oxide removal (COR) process. In one embodiment, the COR process comprises exposing the structure 100 to a gaseous mixture of HF and ammonia at a pressure of about 30 mTorr or below, preferably at a pressure between about 1 mTorr and about 100 mTorr, and a temperature of about 25° C., or a temperature slightly above room temperature. The ratio of gaseous HF to gaseous ammonia is from about 1:10 to about 10:1, with a ratio of about 2:1 being more highly preferred. A solid reaction product is formed as a result of the structure 100 being exposed to HF and ammonia gas. The solid reaction product includes etched oxide, reactants, or combinations thereof. The solid reaction product can be removed by (a) heating the structure 100 after the reaction to a temperature about 100° C. thus causing the reaction product to evaporate and then (b) rinsing the structure 100 in water, or removing with an aqueous solution.

Next, with reference to FIG. 3, in one embodiment, a conformal protective layer 310 is formed on top of the structure 100. Illustratively, the conformal protective layer 310 comprises tungsten (W). In one embodiment, the W protective layer 310 is formed by chemical vapor deposition (CVD) of tungsten on top of the entire structure 100.

Next, in one embodiment, a top portion 310' of the W protective layer 310 directly above the oxide positioning region 260' is removed so as to expose a top surface 272 of the polysilicon capping region 270 to the surrounding ambient. Illustratively, the top portion 310' of the W protective layer 310 is removed by a directional etching of the W protective layer 310 and can be a reactive ion etch (RIE). It should be noted that the directional etching of the W protective layer 310 removes the entire W protective layer 310 except for side wall portions 310a and 310b (FIG. 4) of the W protective layer 310 on side walls of the block 250,260,270.

Figure 4:
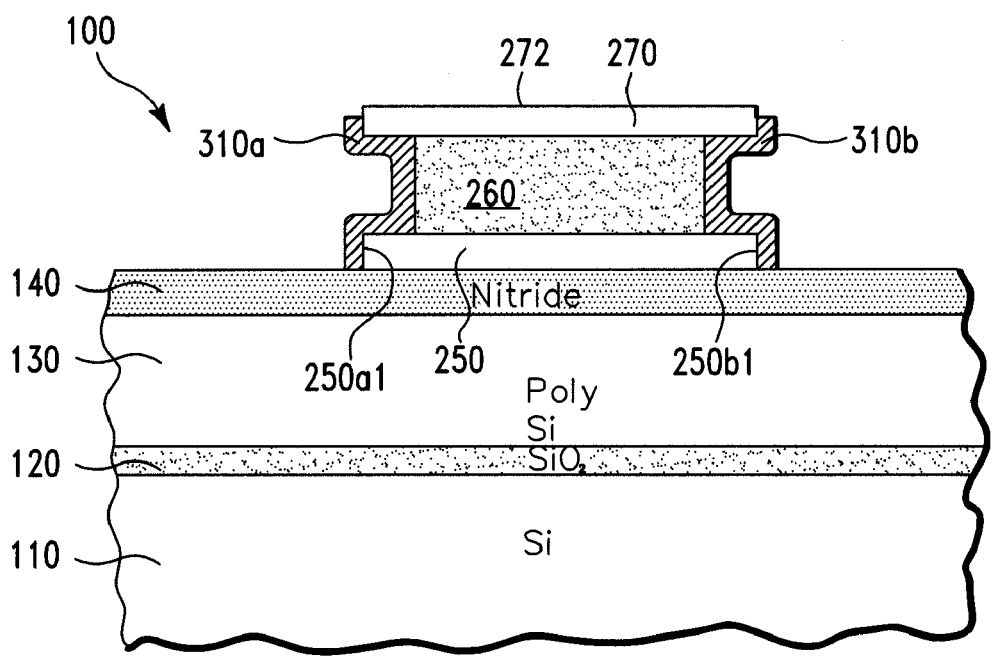

Next, with reference to FIG. 4, in one embodiment, the polysilicon capping region 270 and the oxide positioning region 260' are in turn removed in that order. Illustratively, the polysilicon capping region 270 can be removed first by, illustratively, a wet etch selective to (a) the W side wall portions 310a and 310b, (b) the nitride hard mask layer 140, and (c) the oxide positioning region 260'. Then, the oxide positioning region 260' can be removed by, illustratively, a wet etch selective to (i) the W side wall portions 310a and 310b, (ii) the nitride hard mask layer 140, and (iii) the polysilicon memory region 250.

Figure 5:
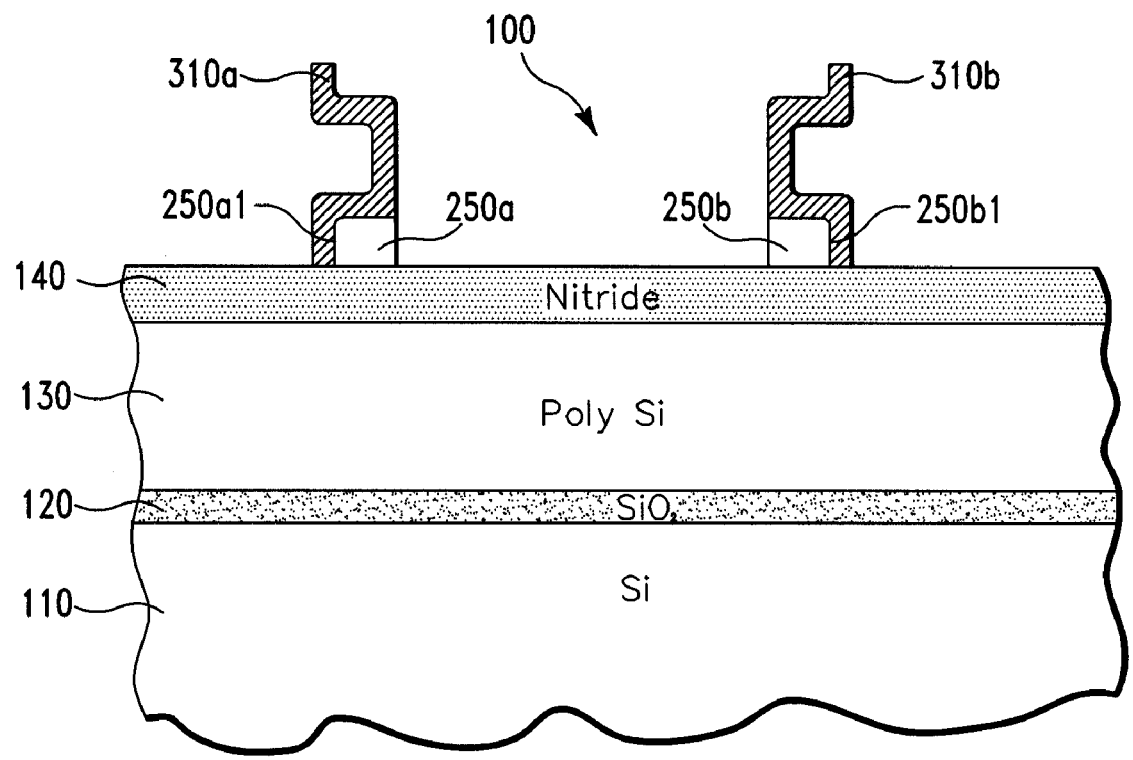

Next, in one embodiment, the W side wall portions 310a and 310b are used as a blocking mask for directionally and selectively etching the polysilicon memory region 250 stopping at the nitride hard mask layer 140. As a result, what remain of the polysilicon memory region 250 are memory portions 250a and 250b (FIG. 5) directly beneath the W side wall portions 310a and 310b. The resulting structure 100 is shown in FIG. 5. In one embodiment, the etching of the polysilicon memory region 250 can be a reactive ion etching (RIE) process.

Next, with reference to FIG. 5, in one embodiment, the W side wall portions 310a and 310b are removed by, illustratively, a wet etch. Then, the memory portions 250a and 250b are used as a blocking mask for etching through the nitride hard mask layer 140 stopping at the polysilicon gate electrode layer 130, resulting in the structure 100 of FIG. 6. As a result, what remain of the nitride hard mask layer 140 after the etching of the nitride hard mask layer 140 is the nitride portions 140a and 140b (FIG. 6) directly beneath the W side wall portions 310a and 310b, respectively.

Figure 6:
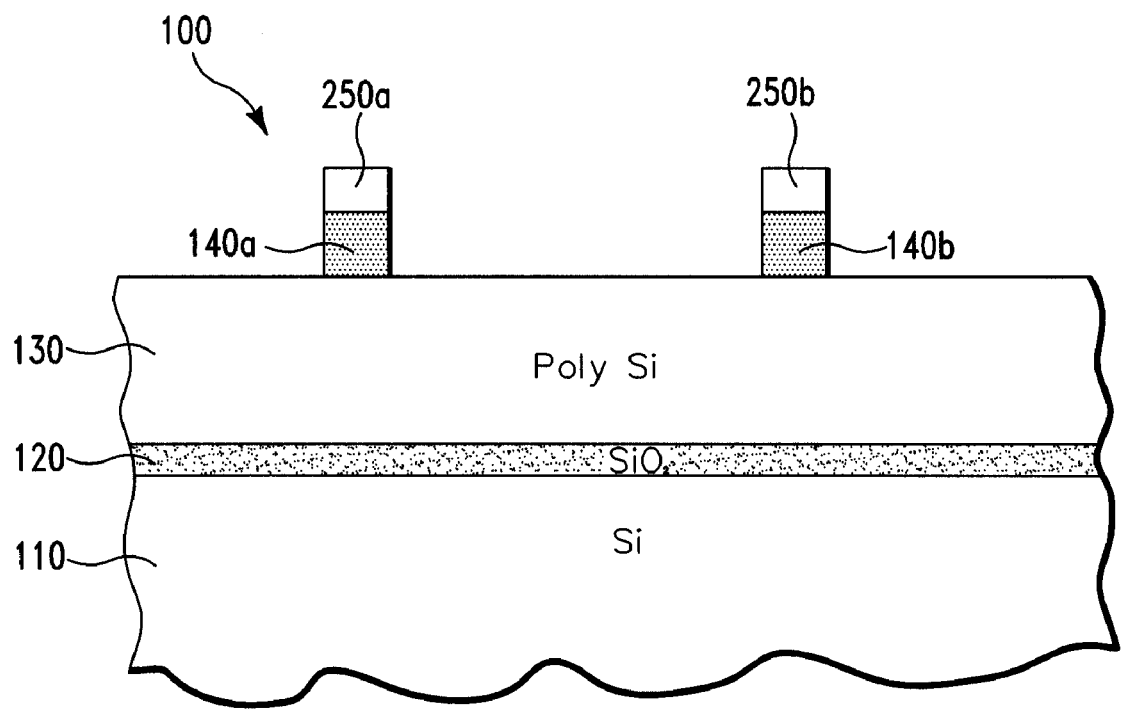
Figure 7:
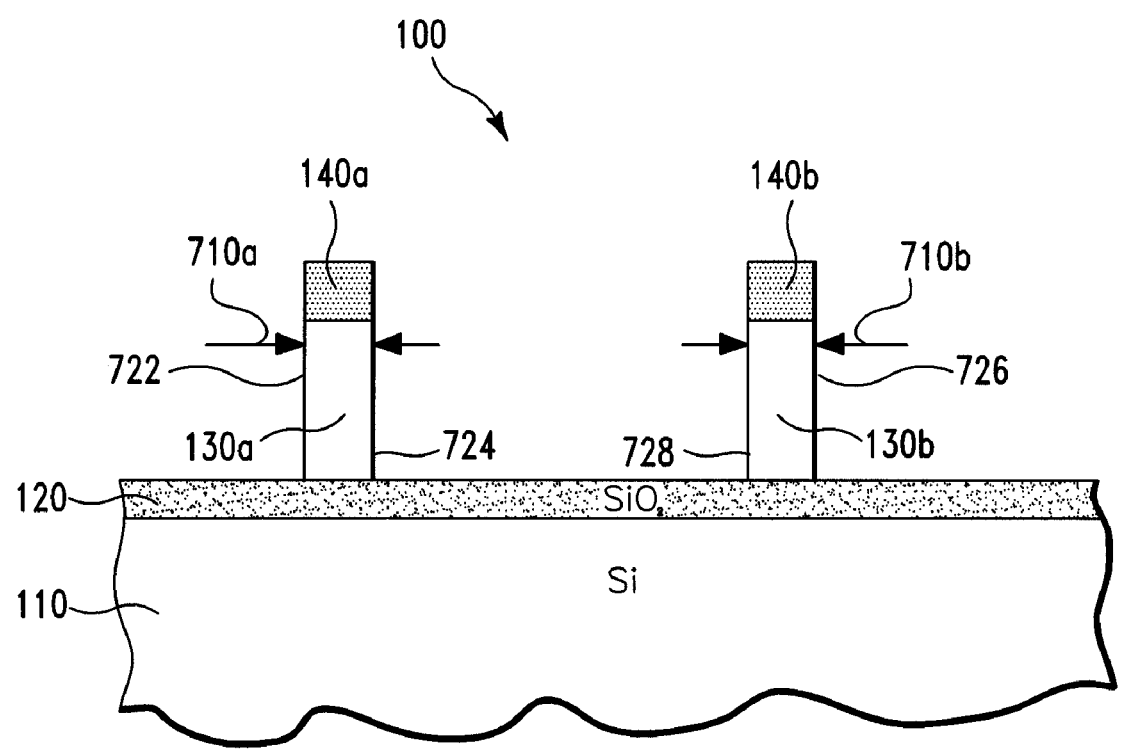
Figure 8:
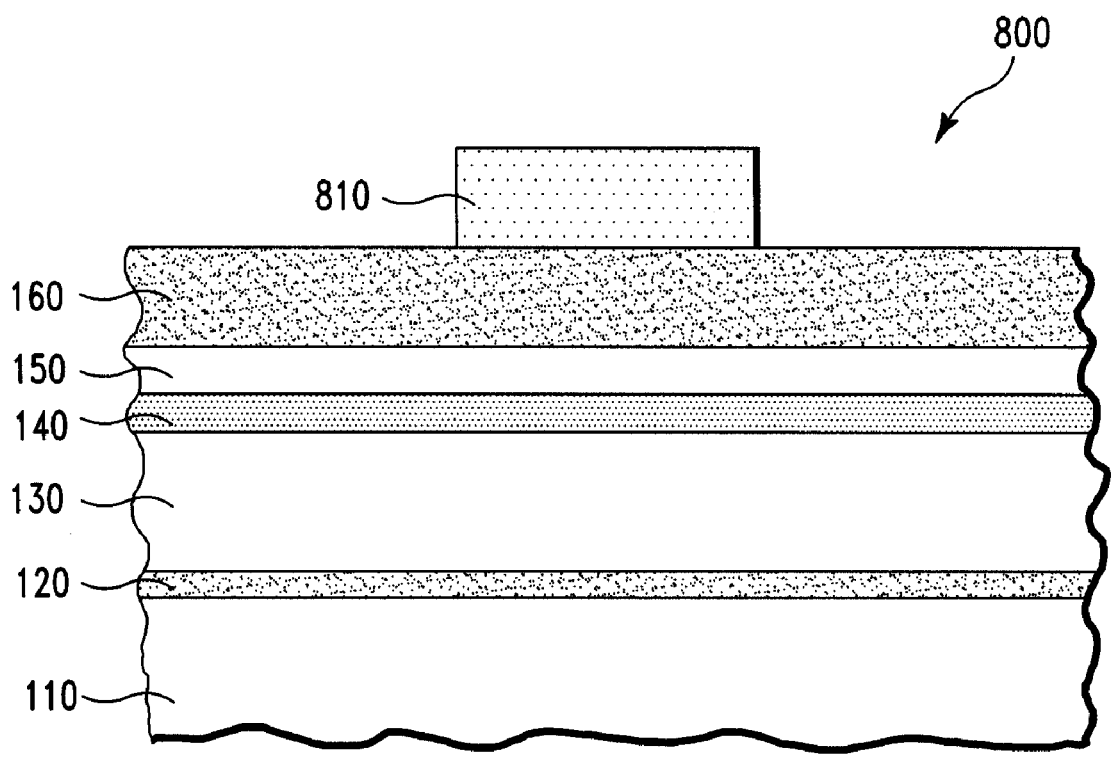
FIGS. 8-16 show cross-section views of another structure going through fabrication steps of another improved sidewall image transfer (SIT) process, in accordance with embodiments of the present invention.

Next, with reference to FIG. 6, in one embodiment, the nitride portions 140a and 140b are used as a blocking mask for etching through the polysilicon gate electrode layer 130 stopping at the gate dielectric layer 120, resulting in the structure 100 of FIG. 7. As a result, what remain of the polysilicon gate electrode layer 130 after the etching of the polysilicon gate electrode layer 130 are the gate electrode regions 130a and 130b (FIG. 7) directly beneath the nitride portions 140a and 140b, respectively. It should be noted that the etching of the polysilicon gate electrode layer 130 also removes the polysilicon memory portions 250a and 250b.

With reference to FIG. 7, in one embodiment, the gate electrode regions 130a and 130b can operate as gate electrodes for two transistors (not shown) whose source/drain regions can be formed in the semiconductor substrate 110.

It should be noted that the edge 722 of the gate electrode region 130a is aligned with the side wall 280a (FIG. 2) of the block 250,260,270, whereas the edge 724 of the gate electrode region 130a is aligned with the side wall 260a (FIG. 3) of the oxide positioning region 260'. In other words, the width 710a of the gate electrode region 130a is equal to the indentation degree 320a (FIG. 3) by which the oxide positioning region 260 (FIG. 2) is indented.

Similarly, the edge 726 of the gate electrode region 130b is aligned with the side wall 280b (FIG. 2) of the block 250,260,270, whereas the edge 728 of the gate electrode region 130b is aligned with the side wall 260b (FIG. 3) of the oxide positioning region 260'. In other words, the width 710b of the gate electrode region 130b is equal to the indentation degree 320b (FIG. 3) by which the oxide positioning region 260 (FIG. 2) is indented.

It should be noted that the indentation degrees 320a and 320b (FIG. 3) are essentially the same, and, therefore, the widths 710a and 710b of the gate electrode regions 130a and 130b, respectively, are essentially the same.

In summary, the improved sidewall image transfer (SIT) process of the present invention starts with the formation of the block 250,260,270 (FIG. 2) whose side walls 280a and 280b determine the edges 722 and 726 (FIG. 7) of the gate electrode regions 130a and 130b, respectively. Next, the oxide positioning region 260 (FIG. 2) of the block 250,260, 270 is indented with the indentation degrees 320a and 320b (FIG. 3) which determine the widths 710a and 710b (FIG. 7) of the gate electrode regions 130a and 130b, respectively. Because the indentation degrees 320a and 320b (FIG. 3) can be precisely controlled using the COR process (which has been known to be very precisely controlled itself), the widths 710a and 710b (FIG. 7) of the gate electrode regions 130a and 130b can also be precisely controlled.

In the embodiments described above, with reference to FIG. 3, the protective layer 310 is conformally formed to protect the edges 250a1 and 250b1 of the polysilicon memory region 250 (FIG. 4) during the subsequent directional etching of the memory region 250 (FIG. 4) so as to form memory portions 250a and 250b (FIG. 5). Alternatively, the protective layer 310 can be blanket deposited on the entire structure 100 of FIG. 2 (after the positioning region 260 of FIG. 2 is indented). Illustratively, the protective layer 310 can comprise an organic material and can be spin-applied on the entire structure 100.

FIGS. 8-16 show cross-section views of another structure 800 going through fabrication steps of a second improved sidewall image transfer (SIT) process, in accordance with embodiments of the present invention. More specifically, with reference to FIG. 8, in one embodiment, the second improved SIT process starts out with a semiconductor substrate 110, a gate dielectric layer 120, a gate electrode layer 130, a hard mask layer 140, a memory layer 150, a positioning layer 160, and a patterned photoresist layer 810 on top of one another as shown. Illustratively, the layers 110, 120, 130, 140, 150, and 160 comprise silicon (Si), silicon dioxide ($SiO_2$), polysilicon, silicon nitride, polysilicon, and silicon dioxide, respectively. It should be noted that similar regions have the same reference numerals. For example, the silicon substrate 110 (FIG. 1) and the silicon substrate 110 (FIG. 8) are similar, so they share the same reference numeral 110.

Next, in one embodiment, the patterned photoresist layer 810 is used as a blocking mask to etch the oxide positioning layer 160 and then the polysilicon memory layer 150 so as to form the oxide positioning region 860 and the polysilicon memory region 850 (FIG. 9) from the oxide positioning layer 160 and the polysilicon memory layer 150, respectively. The resulting structure 800 is shown in FIG. 9.

Figure 9:
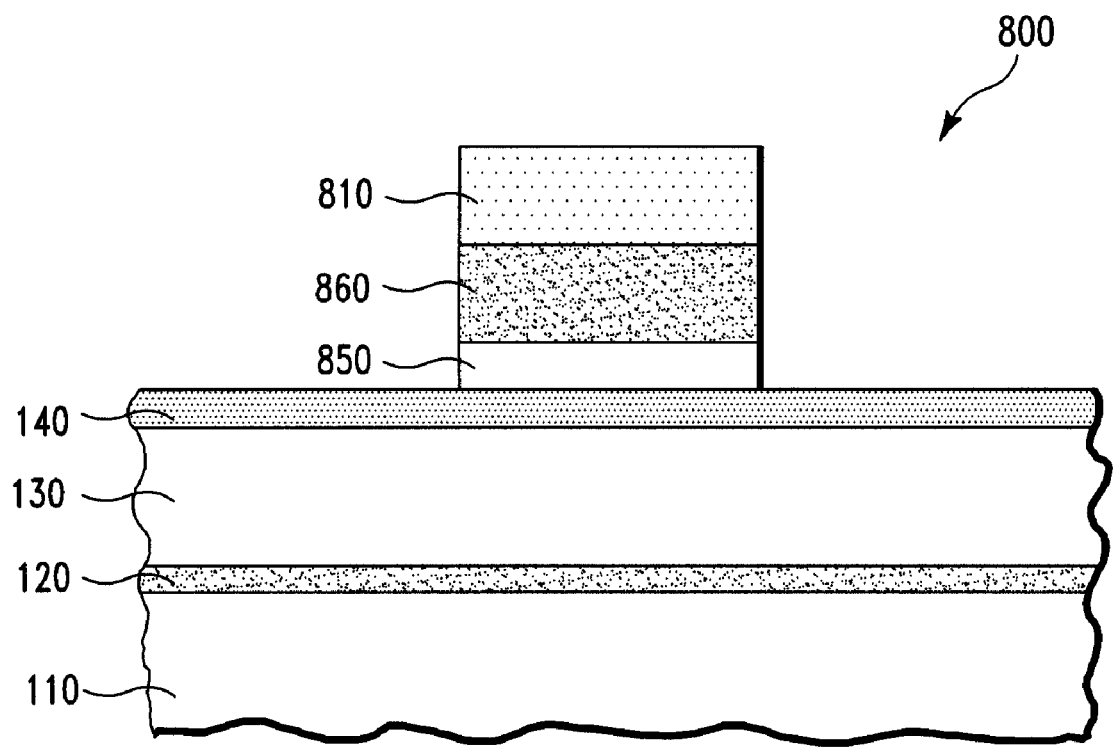
Figure 10:
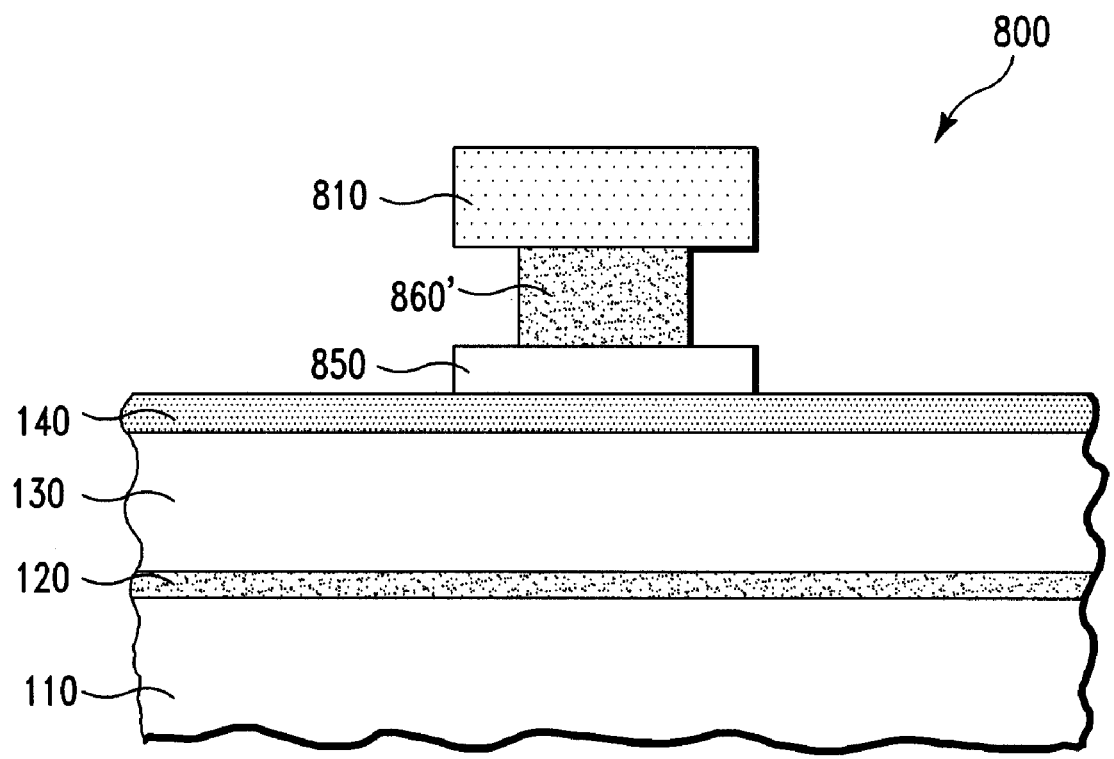

Next, with reference to FIG. 9, in one embodiment, the oxide positioning region 860 is laterally indented (i.e., trimmed) so as to undercut the patterned photoresist layer 810 resulting in the oxide positioning region 860' of FIG. 10. Illustratively, the oxide positioning region 860 is laterally indented by a chemical oxide removal (COR) process. The resulting structure 800 is shown in FIG. 10.

Next, with reference to FIG. 10, in one embodiment, the patterned photoresist layer 810 is removed by, illustratively, a wet etch.

Figure 11:
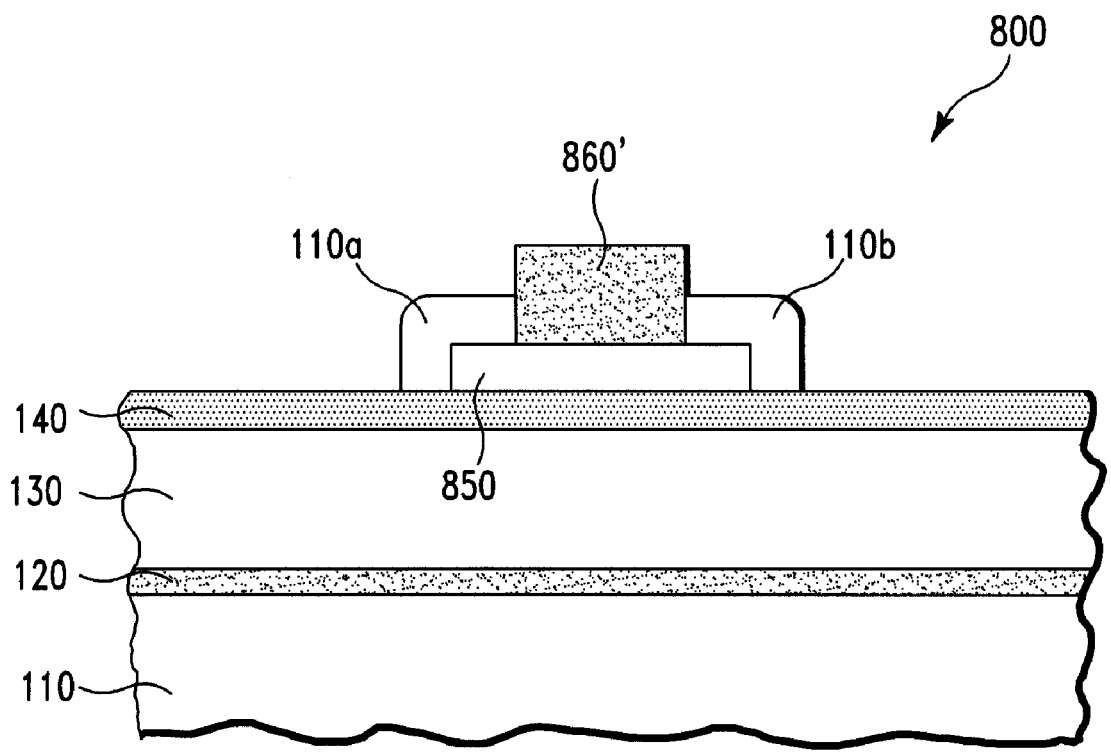

Next, with reference to FIG. 11, in one embodiment, protective regions 1110a and 1110b are formed by, illustratively, selectively growing a material onto exposed-to-ambient surfaces of the memory region 850 but not onto exposed-to-ambient surfaces of the hard mask layer 140 and the positioning region 860' such that the positioning region 860' is still exposed to the surrounding ambient as shown in FIG. 11 after the selective growth. Illustratively, germanium can be selectively grown from exposed-to-ambient surfaces of the polysilicon memory region 850 but not from exposed-to-ambient surfaces of the nitride hard mask layer 140 and the oxide positioning region 860' so as to form the germanium protective regions 1110a and 1110b such that the oxide positioning region 860' is still exposed to the surrounding ambient as shown in FIG. 11. The resulting structure 800 is shown in FIG. 11.

Next, in one embodiment, the oxide positioning region 860' is removed by, illustratively, a wet etch selective to (i.e., essentially without affecting) the protective regions 1110a and 1110b, the nitride hard mask layer 140, and the polysilicon memory region 850. The resulting structure 800 is shown in FIG. 12.

Figure 12:
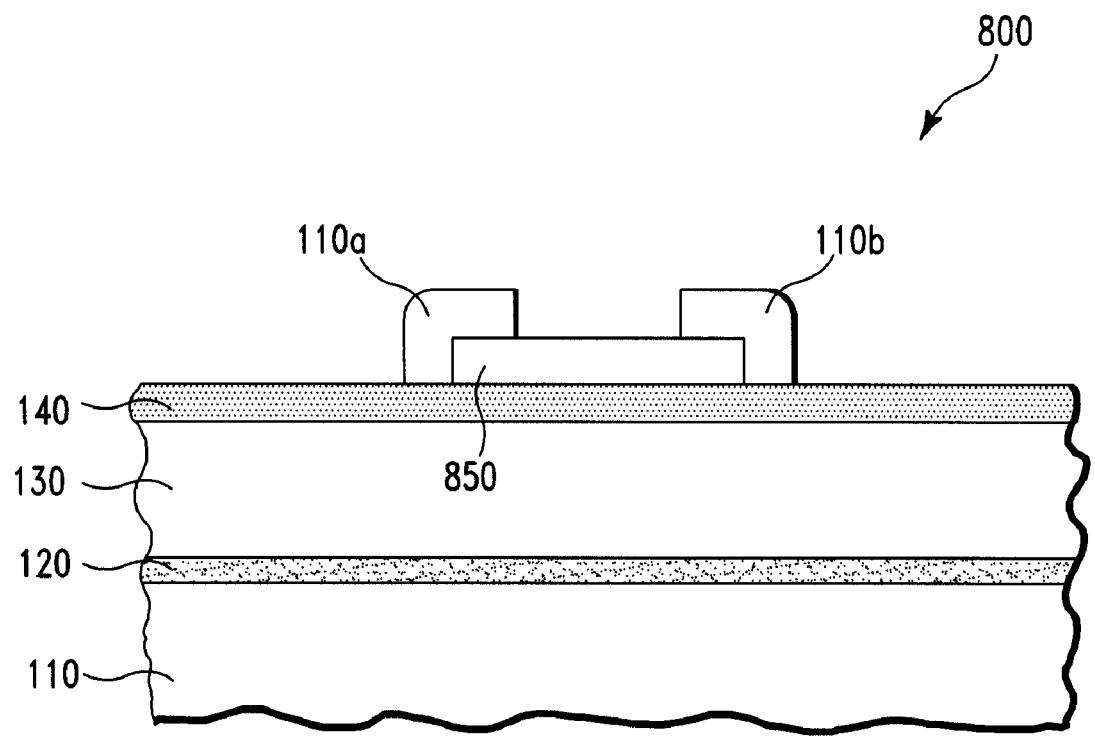
Figure 13:
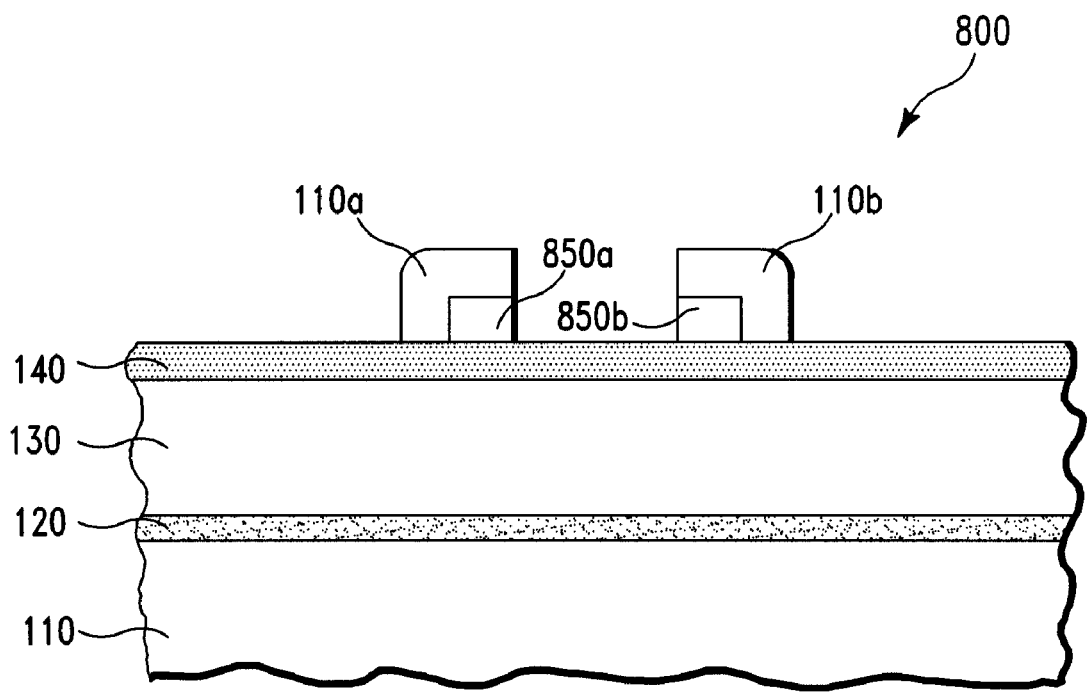

Next, with reference to FIG. 12, in one embodiment, the germanium protective regions 1110a and 1110b are used as a blocking mask to directionally etch the polysilicon memory region 850 so as to form polysilicon memory portions 850a and 850b (FIG. 13). The resulting structure 800 is shown in FIG. 13. The directional etching of the polysilicon memory region 850 can be a RIE (reactive ion etch). In one embodiment, mildly-selective dry etch recipe is used for etching the polysilicon memory region 850, so that germanium of the germanium protective regions 1110a and 1110b will erode only slowly during the directional etching of the polysilicon memory region 850. In one embodiment, the germanium protective regions 1110a and 1110b are only thick enough so that they do not completely erode anywhere. Some amount of germanium erosion is acceptable. In one embodiment, the polysilicon memory region 850 is only thick enough to mask the subsequent etching of the hard mask layer 140. As a result, the etching of the polysilicon memory region 850 does not take long, and therefore, the amount of germanium erosion is not excessive.

Next, with reference to FIG. 13, in one embodiment, the germanium protective regions 1110a and 1110b are removed by, illustratively, a wet etch. For instance, a hydrogen peroxide mixture can be used to oxidize germanium of the germanium protective regions 1110a and 1110b and then water is used to rinse off the oxidized germanium thereby removing the germanium protective regions 1110a and 1110b. The resulting structure 800 is shown in FIG. 14.

Figure 14:
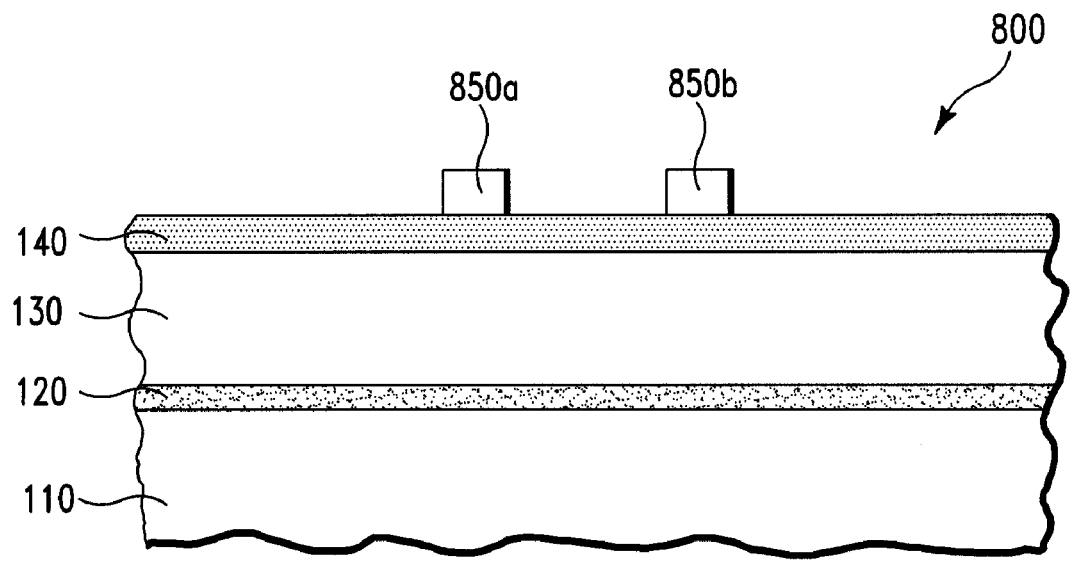

Next, with reference to FIG. 14, in one embodiment, the polysilicon memory portions 850a and 850b are used as a blocking mask to etch the nitride hard mask layer 140 so as to form nitride portions 140a and 140b (FIG. 15) from the nitride hard mask layer 140. The resulting structure 800 is shown in FIG. 15.

Figure 15:
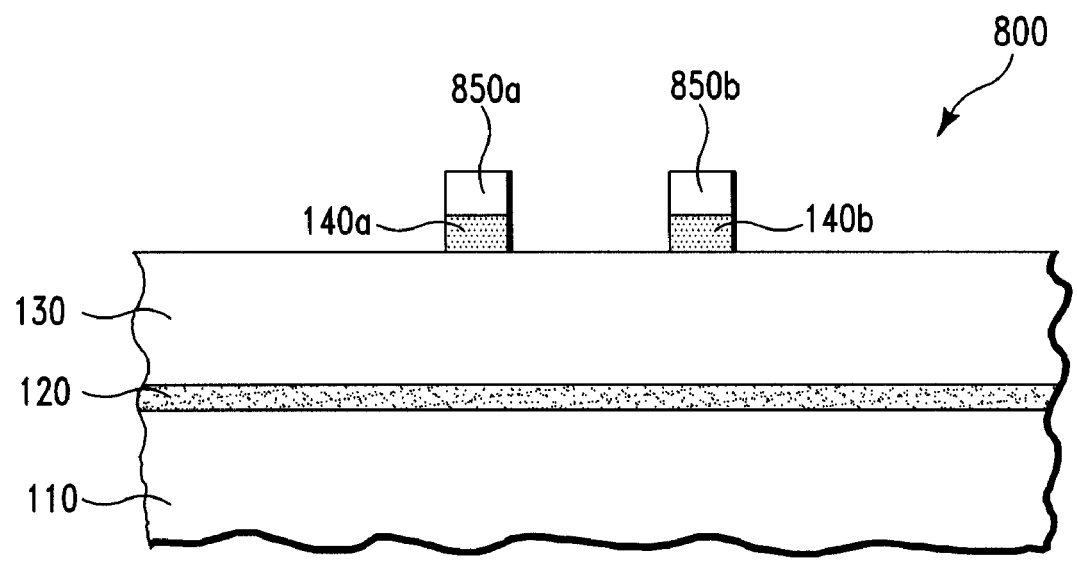
Figure 16:
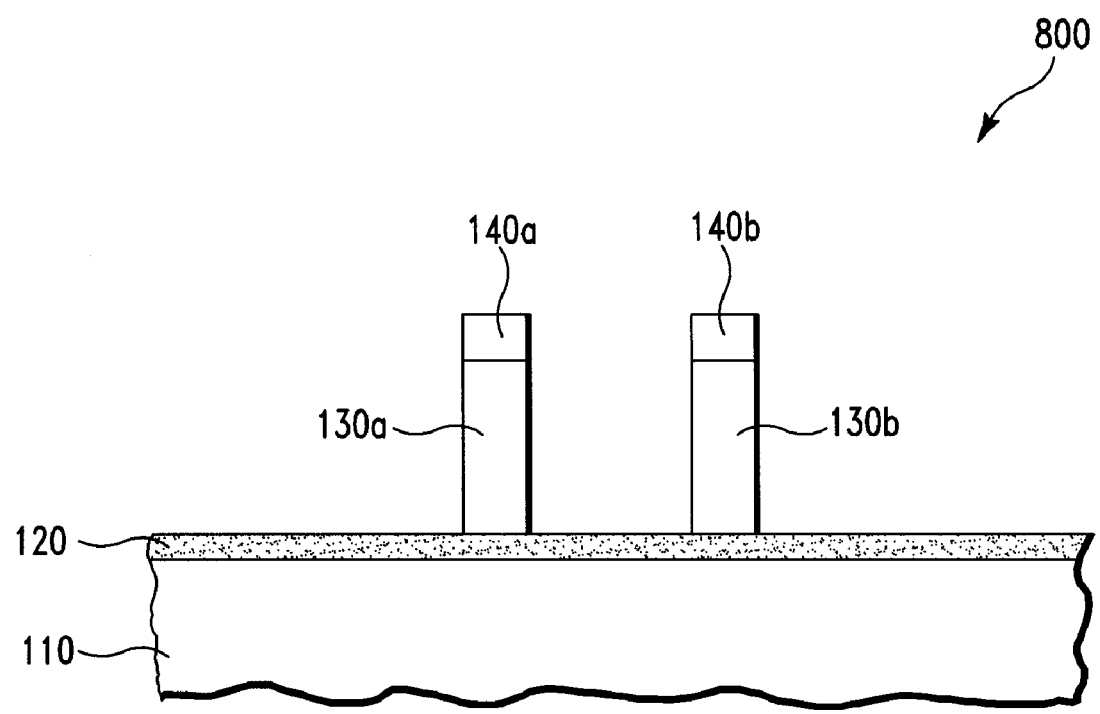

Next, with reference to FIG. 15, in one embodiment, the nitride portions 140a and 140b are used as a blocking mask to etch the gate electrode layer 130 so as to form gate electrode regions 130a and 130b (FIG. 16) from the gate electrode layer 130. The resulting structure 800 is shown in FIG. 16. The structure 800 of FIG. 16 and the structure 100 of FIG. 7 are similar and can be used for similar purposes.

In the embodiments described above, with reference to FIG. 11, the protective regions 1110a and 1110b are selectively grown from exposed-to-ambient surfaces of the polysilicon memory region 850 but not from exposed-to-ambient surfaces of the hard mask layer 140 and the oxide positioning region 860' such that the oxide positioning region 860' is still exposed to the surrounding ambient. In an alternative embodiment, the protective regions 1110a and 1110b are selectively grown from exposed-to-ambient surfaces of the polysilicon memory region 850 and from the hard mask layer 140 but not from exposed-to-ambient surfaces of the oxide positioning region 860' such that the oxide positioning region 860' is still exposed to the surrounding ambient. Then, the rest of the fabrication process can be performed in a similar manner as described above.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure fabrication method, comprising:
   providing a structure which comprises (a) a to-be-etched layer, (b) a memory region on the to-be-etched layer, (c) a positioning region on the memory region such that the memory region is sandwiched between the to-be-etched layer and the positioning region, (d) and a capping region on the positioning region such that the positioning region is sandwiched between the memory region and the capping region;
   indenting the positioning region so as to undercut the capping region;
   forming a conformal protective layer on exposed-to-ambient surfaces of the structure after said indenting is performed;
   removing portions of the conformal protective layer so as to expose the capping region to the surrounding ambient without exposing the memory region to the surrounding ambient;
   removing the capping region, after said removing the portions of the conformal protective layer is performed, so as to expose the positioning region to the surrounding ambient;
   removing the positioning region, after said removing the capping region is performed, so as to expose the memory region to the surrounding ambient; and
   directionally etching the memory region with remaining portions of the conformal protection layer serving as a blocking mask for said directionally etching the memory region, after said removing the positioning region is performed.

2. The method of claim 1, wherein the positioning region comprises an oxide material.

3. The method of claim 1, wherein the capping region does not comprise a photoresist material.

4. The method of claim 1, further comprising directionally etching the to-be-etched layer with the etched memory region serving as a blocking mask for said directionally etching the to-be-etched layer, after said directionally etching the memory region is performed.

5. The method of claim 1,
   wherein the positioning region comprises an oxide material, and
   wherein said indenting the positioning region comprises performing a chemical oxide removal process to the structure.

6. The method of claim 5, wherein said performing the chemical oxide removal process to the structure comprises exposing the structure to a gaseous mixture comprising HF.

7. The method of claim 1, wherein said forming the conformal protective layer comprises performing a chemical vapor deposition of a material on the exposed-to-ambient surfaces of the structure.

8. The method of claim 1, wherein said removing the portions of the conformal protective layer comprises directionally etching the conformal protective layer.

9. The method of claim 8, wherein the conformal protective layer comprises tungsten.

10. The method of claim 1, wherein said directionally etching the memory region is a reactive ion etching process.

11. A structure fabrication method, comprising:
    providing a structure which comprises (a) a to-be-etched layer, (b) a memory layer on the to-be-etched layer, (c) a positioning layer on the memory layer such that the memory layer is sandwiched between the to-be-etched layer and the positioning layer, (d) and a capping region on the positioning layer such that the positioning layer is sandwiched between the memory layer and the capping region;
    directionally etching the positioning layer and the memory layer with the capping region serving as a blocking mask for said directionally etching the positioning layer and the memory layer, wherein what remain of the positioning layer and the memory layer as a result of said directionally etching the positioning layer and the memory layer comprise a positioning region and a memory region, respectively;
    indenting the positioning region so as to undercut the capping region; forming a conformal protective layer on exposed-to-ambient surfaces of the structure after said indenting is performed;
    removing portions of the conformal protective layer so as to expose the capping region to the surrounding ambient without exposing the memory region to the surrounding ambient;
    removing the capping region, after said removing the portions of the conformal protective layer is performed, so as to expose the positioning region to the surrounding ambient;
    removing the positioning region, after said removing the capping region is performed, so as to expose the memory region to the surrounding ambient; and
    directionally etching the memory region with remaining portions of the conformal protection layer serving as a blocking mask for said directionally etching the memory region, after said removing the positioning region is performed.

12. The method of claim 11, wherein the positioning region comprises an oxide material.

13. The method of claim 12, wherein the oxide material comprises silicon dioxide.

14. The method of claim 11, further comprising directionally etching the to-be-etched layer with the etched memory region serving as a blocking mask for said directionally etching the to-be-etched layer, after said directionally etching the memory region is performed.

15. The method of claim 11,
wherein the positioning region comprises an oxide material, and
wherein said indenting the positioning region comprises performing a chemical oxide removal process to the structure.

16. A structure fabrication method, comprising:
providing a structure which comprises (a) a to-be-etched layer, (b) a memory region on the to-be-etched layer, (c) a positioning region on the memory region such that the memory region is sandwiched between the to-be-etched layer and the positioning region, (d) and a capping region on the positioning region such that the positioning region is sandwiched between the memory region and the capping region;
indenting the positioning region so as to undercut the capping region;
forming a protective layer on exposed-to-ambient surfaces of the structure after said indenting is performed;
removing portions of the protective layer so as to expose the capping region to the surrounding ambient without exposing the memory region to the surrounding ambient;
removing the capping region, after said removing the portions of the protective layer is performed, so as to expose the positioning region to the surrounding ambient;
removing the positioning region, after said removing the capping region is performed, so as to expose the memory region to the surrounding ambient; and
directionally etching the memory region with remaining portions of the protection layer serving as a blocking mask for said directionally etching the memory region, after said removing the positioning region is performed.

17. The method of claim 16, wherein the positioning region comprises an oxide material.

18. The method of claim 17, wherein the oxide material comprises silicon dioxide.

19. The method of claim 16,
wherein the positioning region comprises an oxide material, and
wherein said indenting the positioning region comprises performing a chemical oxide removal process to the structure.

20. The method of claim 16, wherein said forming the protective layer comprises spin-applying an organic material on exposed-to-ambient surfaces of the structure.

21. A structure fabrication method, comprising:
providing a structure which comprises (a) a to-be-etched layer, (b) a memory region on the to-be-etched layer, (c) a positioning region on the memory region such that the memory region is sandwiched between the to-be-etched layer and the positioning region;
indenting the positioning region such that a first memory portion of the memory region becomes not directly beneath the indented positioning region as a result of said indenting, while a second memory portion of the memory region remains directly beneath the indented positioning region;
selectively growing a protective region onto exposed-to-ambient surfaces of the first memory portion of the memory region but not onto exposed-to-ambient surfaces of the positioning region; removing the positioning region, after said selectively growing is performed, so as to expose the second memory portion of the memory region to the surrounding ambient; and
directionally etching the second memory portion of the memory region with the protective region serving as a blocking mask, after said removing the positioning region is performed.

22. The method of claim 21, wherein the positioning region comprises an oxide material.

23. The method of claim 22, wherein the oxide material comprises silicon dioxide.

24. The method of claim 21,
wherein the positioning region comprises an oxide material, and
wherein said indenting the positioning region comprises performing a chemical oxide removal process to the structure.

25. The method of claim 24, wherein said performing the chemical oxide removal process to the structure comprises exposing the structure to a gaseous mixture comprising HF.

26. The method of claim 21, wherein said selectively growing the protective region comprises selectively growing germanium onto the exposed-to-ambient surfaces of the first memory portion, but not onto the exposed-to-ambient surfaces of the positioning region.

27. The method of claim 26, wherein the memory region comprises polysilicon, and wherein the positioning region comprises an oxide material.

28. The method of claim 21, wherein said selectively growing the protective region comprises growing materials onto exposed-to-ambient surfaces of the to-be-etched layer.

29. The method of claim 21, wherein said selectively growing the protective region does not comprise growing materials onto exposed-to-ambient surfaces of the to-be-etched layer.

30. The method of claim 1, wherein said directionally etching the memory region forms the first memory portion from the memory region.

* * * * *